US006984478B2

(12) United States Patent
Dreher et al.

(10) Patent No.: US 6,984,478 B2
(45) Date of Patent: Jan. 10, 2006

(54) PRINT CONTROL FOR FLEXOGRAPHIC PRINTING

(75) Inventors: Martin Leonhard Dreher, Heusenstamm (DE); Carsten Gasczyk, Hannoversch Muenden (DE)

(73) Assignee: E.I. du Pont de Nemours and Company, Wilmington, DE (US)

( * ) Notice: Subject to any disclaimer, the term of this patent is extended or adjusted under 35 U.S.C. 154(b) by 113 days.

(21) Appl. No.: 10/659,069

(22) Filed: Sep. 10, 2003

(65) Prior Publication Data

US 2004/0126682 A1 Jul. 1, 2004

Related U.S. Application Data

(60) Provisional application No. 60/411,075, filed on Sep. 16, 2002.

(51) Int. Cl.

| | |
|---|---|
| ***G03F 7/00*** | (2006.01) |
| ***G03F 7/027*** | (2006.01) |
| ***G03F 7/20*** | (2006.01) |
| ***G03F 7/30*** | (2006.01) |
| ***G03F 7/36*** | (2006.01) |

(52) U.S. Cl. ........................ 430/30; 436/300; 436/302; 436/306; 436/944

(58) Field of Classification Search .................. 430/30, 430/271.1, 306, 281.1, 273.1, 944
See application file for complete search history.

(56) References Cited

U.S. PATENT DOCUMENTS

| | | |
|---|---|---|
| 3,393,618 A | 7/1968 | Baker |
| 4,427,759 A | 1/1984 | Gruetzmacher et al. |
| 5,123,352 A | 6/1992 | Luttrell |

FOREIGN PATENT DOCUMENTS

| | | |
|---|---|---|
| DE | 199 09 152 A1 | 9/2000 |
| EP | 0 893 257 A1 | 1/1999 |
| EP | 0 741 330 B1 | 11/1999 |
| JP | 2002 137558 A | 5/2002 |
| WO | WO 94/03838 A1 | 2/1994 |

OTHER PUBLICATIONS

Derwent English Abstract for DE 199 09 152 A1 (Metzger).*

* cited by examiner

*Primary Examiner*—Sin Lee
(74) *Attorney, Agent, or Firm*—Thomas H. Magee

(57) ABSTRACT

A print control for flexographic printing, particularly a flexographic printing form comprising a print control element, and a process for producing such a flexographic printing form.

19 Claims, 1 Drawing Sheet

PRINT CONTROL FOR FLEXOGRAPHIC PRINTING

FIELD OF THE INVENTION

This invention pertains to a print control for flexographic printing, particularly a flexographic printing form comprising a print control element, and a process for producing such a flexographic printing form comprising a print control element.

BACKGROUND OF THE INVENTION

Flexographic printing plates are well known for use in relief printing on a variety of substrates such as paper, corrugated board, films, foils and laminates. Flexographic printing plates can be prepared from photosensitive elements comprising a photopolymerizable layer containing an elastomeric binder, a monomer, and a photoinitiator, interposed between a support and a cover sheet or multilayer cover element. A preferred process of making such photosensitive elements is described in U.S. Pat. No. 4,460,675 where a previously extruded photopolymerizable composition is fed into the nip of a calender and is calendered between a support and a multilayer cover element to form a photopolymerizable layer. Upon imagewise exposure of the photosensitive element with actinic radiation through a photomask, the exposed areas of the photopolymerizable layer are insolubilized. A common technique for bringing a photosensitive element and a photomask into close contact with one another is to juxtapose the element and mask, and draw a vacuum from between them usually by use of a vacuum frame. Treatment with a suitable solvent or thermal treatment combined with contacting an outermost surface of the element to an absorbent surface after imagewise exposure removes the unexposed areas of the photopolymerizable layer leaving a printing relief which can be used for flexographic printing. Such materials are described in U.S. Pat. No. 4,323,637; U.S. Pat. No. 4,427,759; and U.S. Pat. No. 4,894,315. Thermal development of photosensitive elements to form flexographic printing plates is described in U.S. Pat. No. 5,015,556; U.S. Pat. No. 5,175,072; U.S. Pat. No. 5,215,859; and WO 98/13730.

Digital methods and associated recording materials that do not require a separate photomask have been developed and are described in WO 94/03838, WO 94/03839, WO 96/16356, and EP 0767 407. Such recording materials comprise a conventional photopolymerizable layer, as previously described, and additionally a layer capable of forming an integrated photomask. The additional layer is sensitive to infrared radiation and opaque to actinic radiation, a so-called infrared sensitive or IR-sensitive layer. This infrared sensitive layer is imaged digitally, whereby the infrared sensitive material is imagewise vaporized or transferred to a superposed film. Subsequent overall exposure of the photosensitive element through the resulting integrated photomask, washing off unpolymerized areas and remaining areas of the infrared sensitive layer, and drying the element yield a flexographic printing plate. Another method to produce flexographic printing plates is by imagewise ablating with a laser parts of a laser-engravable, reinforced elastomeric material thereby forming a printing relief. Such materials and processes are described in U.S. Pat. No. 5,798,202, U.S. Pat. No. 5,804,353 and EP 1 215 044. These digital methods are used for the preparation of flexographic printing plates in sheet form or in cylindrical form.

In the flexographic printing process, the flexographic printing plate is mounted on a printing cylinder (plate cylinder) and the raised parts of the three-dimensional relief formed in the surface of the flexographic printing plate are pressed against an inking unit (called Anilox) in order to be inked on their top surface. Thereafter, the inked raised areas are pressed against a substrate such as paper, foil, etc mounted on an impression cylinder. As the flexographic printing plate and Anilox or substrate are adjusted and limited mechanically, it is the height of the raised parts of the flexographic printing plate's surface that determines the amount of physical impression between flexographic printing plate and Anilox or flexographic printing plate and substrate. Relief areas that are raised higher than others will produce more impression than those that are lower or even recessed. Flexographic printing plates can show small differences in relief heights (up to 25–30 $\mu$m) due to tolerances of the thickness of the raw photosensitive elements and/or caused by their production process. Therefore, the flexographic printing process is usually quite impression-sensitive, i.e., more or less intense contact between flexographic printing plate and Anilox/substrate may impact the print result quite drastically, which is why impression has to be controlled carefully. If the impression is too high, some image areas can be squeezed. Otherwise, if the impression is too low, the ink transfer is insufficient. In both cases, the quality of the resulting flexographic printing images is bad.

An objective judgment of the most suitable impression for all relief areas of a flexographic printing plate is difficult to obtain because of these varying relief heights. So, the impression settings have to be tested individually for every flexographic printing plate in use. It is a question of the pressman's talent and the utilized press precision as to how standardized and reproducible are the chosen settings.

Therefore, it is an object of the present invention to avoid this trial and error procedure for controlling the impression in flexographic printing processes and to provide an easy method for controlling the quality of the resulting prints.

SUMMARY OF THE INVENTION

The present invention is a flexographic printing form comprising a) a support, and b) at least one elastomeric layer on the support having a top surface containing an imagewise printing relief, wherein the top surface also contains in a non-image area a print control element comprising relief elements with defined height differences.

In another embodiment, the invention is directed to a process for preparing such a flexographic printing form, wherein the process comprises A) impressing a negative matrix of the print control element into a top surface of a photosensitive element comprising a) a support, and b) at least one elastomeric photopolymerizable layer on the support containing at least one elastomeric binder, at least one ethylenically unsaturated compound photopolymerizable by actinic radiation, and at least one photoinitiator or photoinitiator system, B) exposing the photosensitive element to actinic radiation through a photomask comprising a negative of both the imagewise relief and print control element to form polymerized areas and unpolymerized areas in the photopolymerizable layer, C) removing the photomask, and D) removing unpolymerized areas to form in the top surface of the photosensitive element an imagewise printing relief and a print control element in a non-image area comprising relief elements with defined height differences.

In a further embodiment, the invention is directed to a flexographic printing form made by such a process.

DETAILED DESCRIPTION OF THE PREFERRED EMBODIMENT(S)

Figure 1:
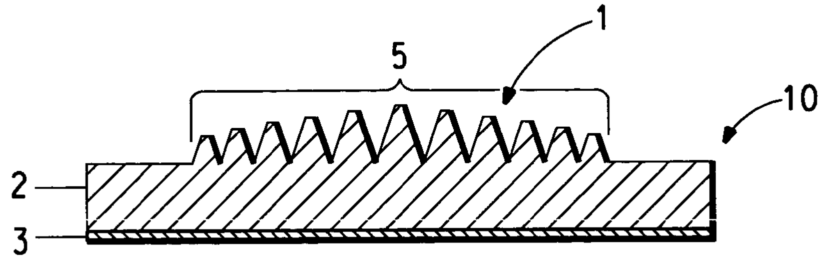
FIG. 1 is a cross-sectional view of a non-image area of a flexographic printing plate showing a print control element of the present invention having relief elements with defined height differences.

The present invention provides an easy and economical way to control and enhance the quality of prints in flexographic printing processes. The present invention also provides a flexographic printing form comprising a print control element, and a process for producing such a flexographic printing form. Furthermore, the invention allows the pressman to easily adjust the impression during flexographic printing by use of a print control element included in the flexographic printing form. The present invention can be integrated in usual flexographic production processes. It can be adopted for all sorts of flexographic printing plates and various types of flexographic composition. Preferably, it is useful with photosensitive flexographic elements, analogue ones as well as digital ones, and also for flexographic printing plates based on laser-engravable, reinforced elastomeric materials. Especially preferred are digital photosensitive flexographic elements.

The main advantage of the present invention is that during printing with a flexographic printing form comprising a print control element the pressman can directly analyze and adjust the impression in the printing process and does not to need to see the results of impressions which are too high or too low. Therefore, high printing quality can be optimized much easier than with former flexographic printing forms and the time between form mounting and the actual printing process run can be achieved much faster and easier, resulting in higher productivity.

Print Control Element

A flexographic printing form according to the present invention contains in a non-image area of its printing surface a print control element comprising relief elements with defined height differences. Whereas, the relief height in the image-wise area can vary in an undefined way, the height of the relief elements in the print control element differs by defined steps. The print control element is formed in the non-image area which is not used for printing the image-wise relief. The print control element is used only during test printing runs for adjusting the settings of the print machine. For example, the print control element comprises at least two relief elements of defined height difference. Preferably, the print control element comprises at least three elements of defined height difference with a center element of defined height and the elements of both sides having the same defined height variations compared to the center element. Especially suitable are print control elements with 8 to 12 elements of defined height difference. The print control element can also be a bar code. But the elements of the test printing relief with defined height variations can also be of any other geometrical form. It is preferred to use elements with defined height difference of 5 to 30 $\mu$m, preferably 10 to 25 $\mu$m, and more preferably 20 to 25 $\mu$m.

A flexographic printing form comprising the print control element is produced by impressing a negative matrix of the print control element into the top surface of the outermost photopolymerizable layer of the photosensitive element. Impressing means physically embossing. The photopolymerizable layer of the raw unpolymerized photosensitive element is still soft and compressible. Therefore, the photopolymerized layer adopts the form of the matrix when the matrix is pressed into the layer and compresses the layer to form the relief elements of different heights. Suitable matrices can be punches, stencil, etc., and can be formed of different materials such as metal, glass, etc.

To keep the outermost photopolymerizable layer of the photosensitive element in the shape it has obtained by impressing the negative matrix of the print control element into its surface, it has to be photopolymerized. So a photomask allowing those parts of the print control element, which are going to form the test printing relief with defined height differences, to be photopolymerized is used for exposure of the photosensitive element with actinic radiation. The non-polymerized areas are removed in the development step.

The print control element can also be prepared by laser-engraving a reinforced elastomeric layer. Especially, when the flexographic printing form itself is prepared by this technique, it is preferable to prepare the print control element in the same way.

When using digital photosensitive flexographic elements, the print control element can also be prepared by filtering the actinic UV light through a high resolution pattern that is imaged into the digital phototool. The high resolution pattern reduces the amount of actinic radiation that is available for photopolymerization behind the digital phototool in a defined way, thus lowering the photopolymerization height. The height of the polymerization structure is controlled through the shape of the high resolution pattern.

By using a print control element with only two relief elements of defined height difference, the pressman will only get from this binary system the information whether the chosen impression is suitable or not. When using a print control element comprising several elements of defined height difference, he can get more detailed information on how he has to enhance or lower the impression. Then he can easily adjust the impression settings by mechanical approximation or lifting off the flexographic printing form to or from the Anilox or the substrate.

Figure 2:
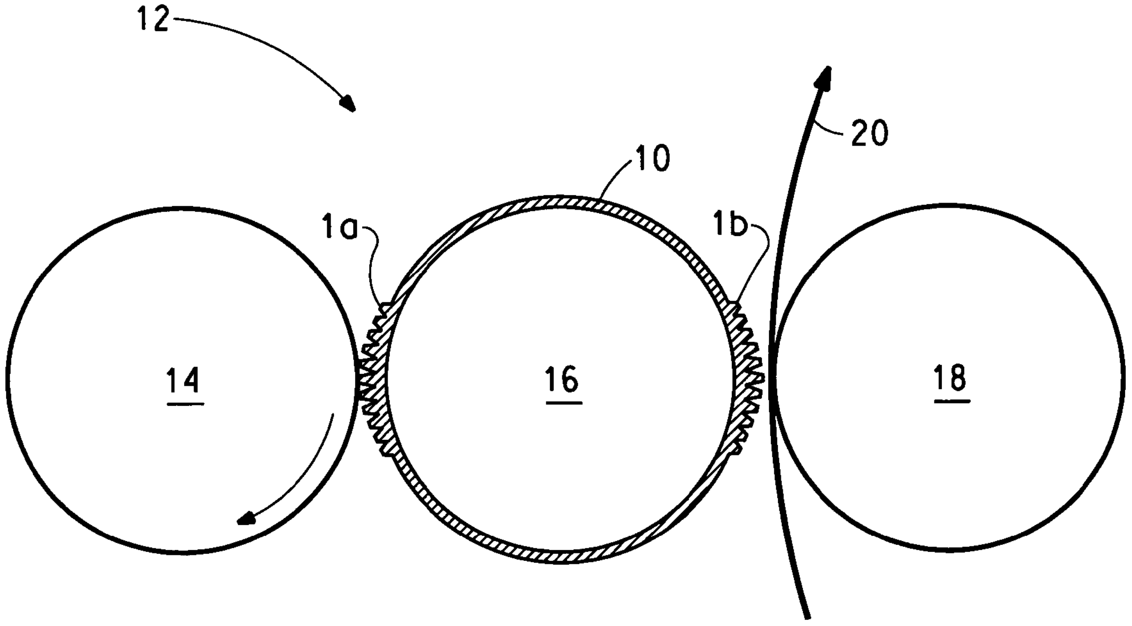
FIG. 2 is a cross-sectional view of a printing press showing an Anilox roll, an impression cylinder, and a printing plate cylinder carrying a flexographic printing plate which has a print control element (shown) being inked (1*a*) and printing (1*b*) and an imagewise printing relief (not shown).

FIG. 1 shows a non-image area of a flexographic printing plate 10 containing a print control element 1 of the present invention, the photopolymer layer including a floor 2, and a support 3. The print control element 1 is shown with multiple relief elements 5, each relief element 5 with a defined height (measured from the floor) different from the relief element adjacent to it. FIG. 2 shows a simplified printing press 12 with an Anilox roll 14, a print plate cylinder 16, and an impression cylinder 18. A substrate 20 which is being printed is supported by the impression cylinder 18. The flexographic printing plate 10 is mounted to the printing cylinder 16. The flexographic printing plate 10 includes a print control element 1*a*, 1*b* with multiple relief elements 5. Ink is transferred to the print control element 1*a* by the Anilox roll 14. The print control element 1*b* with relief elements 5 (which have previously been inked by the Anilox roll 14 transfers ink to the substrate 20. Only one, a few, or all relief elements 5 of the print control element 1 may print on the substrate 20 which will quickly provide the person operating the printing press with information necessary to adjust the printing press settings, such as the impression setting of the Anilox roll 14 to the printing cylinder 16, and the impression setting of the printing cylinder 16 to the impression cylinder 18.

Photosensitive Element

Photopolymerizable Layer

The photopolymerizable layer of the photosensitive element for use as a flexographic printing form consists of known photopolymerizable materials. As used herein, the term "photopolymerizable" is intended to encompass systems which are photopolymerizable, photocrosslinkable, or both. All photopolymerizable materials of the state of the art can be used. Especially preferred are the materials disclosed in U.S. Pat. No. 4,323,637; U.S. Pat. No. 4,427,759; and U.S. Pat. No. 4,894,315. They usually comprise at least one elastomeric binder, at least one photopolymerizable, ethylenically unsaturated monomer, and at least one photoinitiator or photoinitiator system, wherein the photoinitiator is sensitive to actinic radiation, which usually includes ultraviolet radiation and/or visible radiation.

Examples of elastomeric binders are polyalkadienes, alkadiene/acrylonitrile copolymers; ethylene/propylene/alkadiene copolymers; ethylene/(meth)acrylic acid((meth)acrylate copolymers; and thermoplastic, elastomeric block copolymers of styrene, butadiene, and/or isoprene. Linear and radial thermoplastic, elastomeric block copolymers of styrene and butadiene and/or isoprene are preferred. Preferably, the binder is present in an amount of ≧65% by weight of the photopolymerizable material.

Monomers that can be used in the photopolymerizable layer are well known in the art and include ethylenically unsaturated, copolymerizable, organic compounds, such as, for example, acrylates and methacrylates of monovalent or polyvalent alcohols; (meth)acrylamides; vinyl ethers and vinyl esters; etc., in particular acrylic and/or methacrylic of butanediol, hexanediol, diethylene glykol, trimethylol propane, pentaerythritol, etc.; and mixtures of such compounds. Preferably, the monomer is present in an amount of ≧5% by weight of the photopolymerizable material.

Suitable photoinitiators are individual photoinitiators or photoinitiator systems, such as, for example, benzoin derivatives, benzil acetals, diarylphosphine oxides, etc., also mixed with triphenyl phosphine, tertiary amines, etc. Preferably, the photoinitiator is present in an amount of 0.001–10.0% by weight of the photopolymerizable material In addition to the main components described in the foregoing, the photopolymerizable compositions may comprise conventional additives like, for example, UV absorbers, thermal stabilizers, plasticizers, colorants, antioxidants, fillers, etc.

The thickness of the photopolymerizable layer can vary over a wide range depending upon the type of flexographic printing plate desired. For so called "thin plates" the photopolymerizable layer can be from about 0.05–0.17 cm in thickness. Thicker plates will have a photopolymerizable layer up to 0.25–0.64 cm in thickness or greater.

Support

The support can be any flexible material which is conventionally used with photosensitive elements for use as flexographic printing plates. Examples for suitable support materials include polymeric films such those formed by addition polymers and linear condensation polymers, transparent foams and fabrics, and metals such as aluminum. A preferred support is a polyester film; particularly preferred is polyethylene terephthalate. The support typically has a thickness from 0.001–0.030 inch.

Cover Sheet

The photosensitive element optionally comprises a cover sheet as outermost protective layer on top of the matted layer or if present on top of the IR-sensitive layer. Useful cover sheets consist of flexible polymeric films, e.g., polyethylene terephthalate, which preferably is unsubbed but optionally may be subcoated with a thin silicone layer, polystyrene, polyethylene, polypropylene, or other strippable polymeric films. Preferably, polyethylene terephthalate is used.

IS Additional Layers

In a preferred embodiment of the present invention, the photosensitive element comprises an IR-sensitive layer on top of the photopolymerizable layer. The IR-sensitive layer can form an integrated masking layer for the photosensitive element. The preferred IR-sensitive layer is removable during treating, i.e., soluble or dispersible in a developer solution or removable during thermal development; opaque to actinic radiation, i.e., ultraviolet or visible light, that is, has an optical density ≧2.5; and can be imaged with an infrared laser. The IR sensitive layer contains material having high infrared absorption in the wavelength range between 750 and 20,000 nm, such as, for example, polysubstituted phthalocyanine compounds, cyanine dyes, merocyanine dyes, etc., inorganic pigments, such as, for example, carbon black, graphite, chromium dioxide, etc., or metals, such as aluminum, copper, etc. The quantity of infrared absorbing material is usually 0.1–40% by weight, relative to the total weight of the layer. To achieve the optical density of ≧2.5 to block actinic radiation, the infrared-sensitive layer contains a material that prevents the transmission of actinic radiation. This actinic radiation blocking material can be the same or different than the infrared absorbing material, and can be, for example, dyes or pigments, and in particular the aforesaid inorganic pigments. The quantity of this material is usually 1–70% by weight relative to the total weight of the layer. The infrared-sensitive layer optionally includes a polymeric binder, such as, for example, nitrocellulose, homopolymers or copolymers of acrylates, methacrylates and styrenes, polyamides, polyvinyl alcohols, etc. Other auxiliary agents, such as plasticizers, coating aids, etc. are possible. The infrared-sensitive layer is usually prepared by coating or printing a solution or dispersion of the aforesaid components on the cover sheet, and subsequently drying it before the matted layer is applied onto the cover sheet. The thickness of the infrared-sensitive layer is usually 2 nm to 50 μm, preferably 4 nm to 40 μm. These infrared-sensitive layers and their preparation are described in detail, for example in WO 94/03838 and WO 94/3839.

Other additional layers may be present on top of the photopolymerizable layer or between the photopolymerizable layer and the IR-sensitive layer if present. Suitable layers are those disclosed as elastomeric layers in the multilayer cover element described in U.S. Pat. No. 4,427,759 and U.S. Pat. No. 4,460,675. Such elastomeric layers comprise layers which are insensitive to actinic radiation themselves but become photosensitive when contacted with the photopolymerizable layer as well as such layers which are photosensitive themselves. These photosensitive elastomeric layers comprise preferably an elastomeric binder, a monomer, and a photoinitiator, and optionally fillers or other additives. Elastomeric layers which become photosensitive when contacted with the photopolymerizable layer do not comprise any monomer. Binder, monomer, and other compounds can be the same or similar to those compounds comprised in the photopolymerizable layer.

Furthermore, the photosensitive element may optionally comprise a release layer on top of the photopolymerizable layer or on top of the elastomeric layer if present. In case of an IR-sensitive layer being present in the photosensitive element, the release layer is placed between the photopolymerizable layer or the elastomeric layer and the IR-sensitive layer. The release layer enables the easy removal of a mask used for the imagewise exposure of the photosensitive element. The release layer must be flexible, transparent, and non-tacky. It is usually a thin layer, preferably having a thickness of at least 0.5 microns, but less than 10 microns, more preferably less than 4 microns. The release layer preferably is removable during the normal development process. Suitable release layers may include polyamides, polyvinyl alcohols, polyurethanes, polyvinyl pyrrolidones, amphoteric interpolymers, hydroxy cellulosic polymers, polyethylene oxides, copolymers of ethylene and vinyl acetate, and combinations thereof. Optionally, the release layer may comprise inorganic or organic matting agents, colorants, e.g., dyes and/or pigments as well as photochromic additives, i.e., for identification or for better contrast between imaged and non-imaged areas of the photosensitive elements directly after imagewise exposure or after imagewise exposure and development. Release layers comprising matting agents capable of being anchored in the surface of the photopolymerizable layer are especially suitable like those described by Bode et al. in U.S. patent application No. 60/364,956 filed Mar. 14, 2002 (GP-1206/PRV).

The photosensitive element can optionally include a wax layer as disclosed in DE-C 199 09 152 between the infrared-sensitive layer or the optionally matted release layer and the photopolymerizable layer or the elastomeric layer. Suitable waxes are all natural and synthetic waxes, such as polyolefin waxes, paraffin waxes, carnauba waxes, stearin waxes, and steramide waxes. Preferred are waxes with a softening temperature ≧70° C., especially polyethylene waxes having a softening temperature ≧90° C. Conventional methods like casting, printing, or spray coating are used to prepare the wax layers from dispersions of the waxes in suitable solvents. The wax layer is usually 0.02–1.0 $\mu$m thick, preferably 0.05–0.5 $\mu$m.

The photosensitive element can optionally include an adhesive layer between the support and the photopolymerizable layer. Such adhesive materials are disclosed in U.S. Pat. No. 3,036,913 or U.S. Pat. No. 2,760,863. Alternatively, the support can have an adhesion promoting surface by flame-treatment or electron-treatment or the adhesion of the photopolymerizable layer to the support can be enhanced by exposure to actinic radiation through the support.

Furthermore, the photosensitive element can optionally include an antihalation layer between the support and the photopolymerizable layer. Such antihalation layer can be made by dispersing a finely divided dye or pigment which substantially absorbs actinic radiation in a solution or aqueous dispersion of a resin or polymer which is adherent to both the support and the photopolymerizable layer and coating it on the support and drying. Suitable antihalation pigments and dyes include carbon black, manganese dioxide, Acid Blue Black (CI 20470), and Acid Magenta O (CI 42685). Suitable polymeric or resin carriers include polyvinyl compounds, e.g., polyvinyl chloride homo- and copolymers, copolymers of acrylic and methacrylic acid, etc.

Process for Preparing Photosensitive Elements

The photosensitive elements suitable for the present invention can be prepared by common techniques. The photopolymerizable layer itself may be prepared in many ways by admixing the binder, monomer, initiator, and other ingredients and forming it into a sheet layer. Generally, the photopolymerizable mixture is formed into a hot melt and then calendered to the desired thickness. An extruder can be used to perform the function of melting, mixing, deaerating and filtering the composition. The extruded mixture is then calendered between the support and a cover element. Concerning the present invention, this cover element comprises a cover sheet, and optionally one or more additional layers selected from the group consisting of an IR-sensitive layer, an elastomeric layer capable of becoming photosensitive, a release layer, and a wax layer. Alternatively, the photopolymerizable material can be placed between the support and the cover element in a mold. The layers of material are then pressed flat by the application of heat and/or pressure. The combination of extrusion/calendering process is particularly preferred. After the photosensitive element is prepared, it is cooled, e.g., with blown air, and is passed under a bank of fluorescent lamps, e.g., black light tubes, placed traverse to the path of movement. The photosensitive element is continually exposed through the support to partially polymerize a predetermined thickness of the photopolymer layer adjacent the support.

Process for Preparing Flexographic Printing Plates

The essential step of the present invention is done directly before imagewise exposure of the photosensitive element. Therefore, a negative matrix of the print control element is used for embossing the print control element into the surface of the outermost photopolymerizable layer of the photosensitive element in a non-image area. If the photosensitive element is protected by a cover sheet, this cover sheet has to be removed before impression of the matrix into the surface of the photopolymerizable layer. In case that other additional layers like elastomeric layers or release layers form the outermost layer of a photosensitive element, the matrix is pressed into the surface of these layers thereby impressing the test printing relief with defined height differences further into the photopolymerizable layer. In the case in which an IR-sensitive layer is disposed on the photosensitive element, the step of matrix impression can be conducted before or after the photomask is formed by IR laser radiation, but preferably, after the IR laser step. When a photomask is formed from an IR-sensitive layer by laser imaging, it is also possible to image an additional high resolution pattern into a non-image area of the photomask in the same process step. Afterwards, the print control element is formed by exposure of the photopolymerizable layer to actinic radiation through the high resolution pattern.

The photosensitive element is then imagewise exposed by common processes through a photomask having areas transparent to actinic radiation and areas substantially opaque to actinic radiation. Actinic radiation means ultraviolet and visible radiation. The photomask can be a separate film, i.e., an image-bearing transparency or phototool, such as a silver halide film; or can be the photomask integrated with the photosensitive element as described above. In the case in which the photomask is a separate film, the optional cover sheet is usually stripped before imagewise exposure. The photomask is brought into close contact with the photosensitive element by the usual vacuum processes, e.g., by use of a common vacuum frame. Thus a substantially uniform and complete contact between the photosensitive element and the photomask can be achieved in acceptable time.

In the case in which there is a IR-sensitive layer on the photosensitive element, the IR-sensitive layer is imagewise exposed to IR laser radiation to form the photomask on the photosensitive element. The infrared laser exposure can be carried out using various types of infrared lasers, which emit in the range 750 to 20,000 nm. Infrared lasers including, diode lasers emitting in the range 780 to 2,000 nm and Nd:YAG lasers emitting at 1064 nm are preferred. The radiation opaque layer is exposed imagewise to infrared laser radiation to form the image on or disposed above the photopolymerizable layer, i.e., the in-situ mask. The infrared laser radiation can selectively remove, e.g., ablate or vaporize, the infrared sensitive layer (i.e., radiation opaque layer) from the photopolymerizable layer, as disclosed by Fan in U.S. Pat. No. 5,262,275 and U.S. Pat. No. 5,719,009; and Fan in EP 0 741 330 B1. The integrated photomask remains on the photosensitive element for subsequent steps of overall exposure to actinic radiation and treating.

Upon imagewise exposure, the radiation-exposed areas of the photopolymerizable layer are converted to the insoluble state with no significant polymerization or crosslinking taking place in the unexposed areas of the layer. This photopolymerization forms the imagewise printing relief and in a non-image area the print control element comprising a test printing relief with defined height variations. Any conventional source of actinic radiation can be used for this exposure. Examples of suitable radiation sources include xenon lamps, mercury vapor lamps, carbon arcs, argon glow lamps, fluorescent lamps with fluorescent materials emitting UV radiation and electron flash units, and photographic flood lamps. The most suitable sources of UV radiation are the mercury vapor lamps, particularly the sun lamps. The exposure time may vary from a few seconds to minutes, depending upon the intensity and spectral energy distribution of the radiation, its distance from the photosensitive element, and the nature and amount of the photopolymerizable material. An overall back exposure may be conducted before or after the imagewise exposure to polymerize a predetermined thickness of the photopolymer layer adjacent the support. This polymerized portion of the photopolymer layer is designated a floor. The floor thickness varies with the time of exposure, exposure source, etc. This exposure may be done diffuse or directed. All radiation sources suitable for imagewise exposure may be used. The exposure is generally for 1–30 minutes.

Following overall exposure to UV radiation through the mask, the photosensitive printing element is treated to remove unpolymerized areas in the photopolymerizable layer and thereby form a relief image. The treating step removes at least the photopolymerizable layer in the areas which were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerized areas of the photopolymerizable layer. For photosensitive elements including a separate IR-sensitive layer for digital formation of the mask, the treating step also removes the mask image (which had been exposed to actinic radiation).

Treatment of the photosensitive printing element includes (1) “wet” development wherein the photopolymerizable layer is contacted with a suitable developer solution to washout unpolymerized areas and (2) “dry” development wherein the photosensitive element is heated to a development temperature which causes the unpolymerized areas of the photopolymerizable layer to melt or soften or flow and is wicked away by contact with an absorbent material. Dry development may also be called thermal development.

Wet development is usually carried out at about room temperature. The developers can be organic solvents, aqueous or semi-aqueous solutions, or water. The choice of the developer will depend primarily on the chemical nature of the photopolymerizable material to be removed. Suitable organic solvent developers include aromatic or aliphatic hydrocarbon, and aliphatic or aromatic halohydrocarbon solvents, for example, n-hexane, petrol ether, hydrated petrol oils, limonene or other terpenes or toluene, isopropyl benzene, etc., ketones such as methyl ethyl ketone, halogenated hydrocarbons such as chloroform, trichloroethane, or tetrachloroethylene, esters such as acetic acid or acetoacetic acid esters, or mixtures of such solvents with suitable alcohols. Other organic solvent developers have been disclosed in U.S. Pat. No. 5,354,645. Suitable semi-aqueous developers usually contain water and a water miscible organic solvent and an alkaline material. Suitable aqueous developers usually contain water and an alkaline material. Other suitable aqueous developer combinations are described in U.S. Pat. No. 3,796,602. Additives such as surfactants or alcohols may be used.

Development time can vary, but it is preferably in the range of about 2 to about 25 minutes. Developer can be applied in any convenient manner, including immersion, spraying and brush or roller application. Brushing aids can be used to remove the unpolymerized portions of the element. Washout can be carried out in an automatic processing unit which uses developer and mechanical brushing action to remove the unexposed portions of the plate, leaving a relief constituting the exposed image and the floor.

Following treatment by developing in solution, the relief printing plates are generally blotted or wiped dry, and then more fully dried in a forced air or infrared oven. Drying times and temperatures may vary, however, typically the plate is dried for 60 to 200 minutes at 60° C. High temperatures are not recommended because the support can shrink and this can cause registration problems.

Treating the element thermally includes heating the photosensitive element having at least one photopolymerizable layer (and the additional layer/s) to a temperature sufficient to cause the uncured portions of the photopolymerizable layer to soften or melt or flow, and contacting an outermost surface of the element to an absorbent surface to absorb or wick away the melt or flow portions. The polymerized areas of the photopolymerizable layer have a higher melting temperature than the unpolymerized areas and therefore do not melt, soften, or flow at the thermal development temperatures. Thermal development of photosensitive elements to form flexographic printing plates is described in U.S. Pat. No. 5,015,556; U.S. Pat. No. 5,175,072; U.S. Pat. No. 5,215,859; and WO 98/13730.

The term “melt” is used to describe the behavior of the unirradiated portions of the photopolymerizable elastomeric layer subjected to an elevated temperature that softens and reduces the viscosity to permit flow and absorption by the absorbent material. The material of the meltable portion of the photopolymerizable layer is usually a viscoelastic material which does not have a sharp transition between a solid and a liquid, so the process functions to absorb the heated composition layer at any temperature above some threshold for absorption in the absorbent material. A wide temperature range may be utilized to “melt” the composition layer for the purposes of this invention. Absorption may be slower at lower temperatures and faster at higher temperatures during successful operation of the process.

The thermal treating steps of heating the photosensitive element and contacting an outermost surface of the element with an absorbent material can be done at the same time, or in sequence provided that the uncured portions of the photopolymerizable layer are still soft or in a melt state when contacted with the absorbent material. The at least one photopolymerizable layer (and the additional layer/s) are heated by conduction, convection, radiation, or other heating methods to a temperature sufficient to effect melting of the uncured portions but not so high as to effect distortion of the cured portions of the layer. The one or more additional layers disposed above the photopolymerizable layer may soften or melt or flow and be absorbed as well by the absorbent material. The photosensitive element is heated to a surface temperature above about 40° C., preferably from about 40° C. to about 230° C. (104–446° F.) in order to effect melting or flowing of the uncured portions of the photopolymerizable layer. By maintaining more or less intimate contact of the absorbent material with the photopolymerizable layer that is molten in the uncured regions, a transfer of the uncured photosensitive material from the photopolymerizable layer to the absorbent material takes place. While still in the heated condition, the absorbent material is separated from the cured photopolymerizable layer in contact with the support layer to reveal the relief structure. A cycle of the steps of heating the photopolymerizable layer and contacting the molten (portions) layer with an absorbent material can be repeated as many times as necessary to adequately remove the uncured material and create sufficient relief depth. However, it is desirable to minimize the number of cycles for suitable system performance, and typically the photopolymerizable element is thermally treated for 5 to 15 cycles. Intimate contact of the absorbent material to the photopolymerizable layer (while in the uncured portions are melt) may be maintained by the pressing the layer and the absorbent material together.

A preferred apparatus to thermally develop the photosensitive element is disclosed in U.S. Pat. No. 5,279,697, and also by Johnson et al. in Patent Cooperation Treaty Application No. PCT/US00/24400 filed Sep. 6, 2000 (IM-1289 PCT). The photosensitive element may be placed on a drum or a planar surface in order for thermal treatment to be carried out.

The absorbent material is selected having a melt temperature exceeding the melt temperature of the uncured portions of the photopolymerizable layer and having good tear resistance at the same operating temperatures. Preferably, the selected material withstands the temperatures required to process the photosensitive element during heating. The absorbent material is selected from non-woven materials, paper stocks, fibrous woven material, open-celled foam materials, porous materials that contain more or less a substantial fraction of their included volume as void volume. The absorbent material can be in web or sheet form. The absorbent materials should also possess a high absorbency for the molten elastomeric composition as measured by the grams of elastomer that can be absorbed per square millimeter of the absorbent material. Preferred is a non-woven nylon web.

It is also contemplated that the photosensitive element may undergo one or more treating steps to sufficiently remove the uncured portions to form the relief. The photosensitive element may undergo both wet development and dry development, in any order, to form the relief. A predevelopment treating step may be necessary to remove one or more of the additional layers disposed above the photopolymerizable layer if such additional layers are not removable by the washout solution and/or by heating.

The flexographic printing plate may be post exposed and/or chemically or physically after-treated in any sequence to detackify the surface of the flexographic printing plate.

The flexographic printing plate may also be prepared by laser-engraving. By this method, parts of a laser-engravable, reinforced elastomeric material are imagewise ablated with a laser, thereby forming a printing relief. Such materials and processes are described in U.S. Pat. No. 5,798,202; U.S. Pat. No. 5,804,353, and EP 1 215 044. In this case, it is preferred to prepare the print control element by the same technique.

Process of Use

The flexographic printing plate of the present invention, containing in its printing surface an imagewise printing relief and in the non-image area a print control element comprising relief elements with defined height differences, is then printed in the common process. The flexographic printing plate is mounted on a plate cylinder and the raised parts of the three-dimensional relief formed in the surface of the flexographic printing plate area pressed against the Anilox in order to be inked on their top surface. Thereafter, the inked relief areas are pressed against a paper substrate paper and an ink image is formed on the paper. This image shows an image of the design as well as an image of the print control element. The mechanical system settings are adjusted depending on how the print control element is reproduced, meaning which elements of the print control element are reproduced and how they are reproduced. By checking the print control element, the pressman can now easily adjust the settings of the printing machine. The pressman can correct the impression settings by mechanical approximation or lifting off the flexographic printing plate to or from the Anilox or the substrate. The pressman no longer has to interpret the different areas of the printed design and check it for squeezed image areas or areas showing insufficient ink transfer.

What is claimed is:

1. A flexographic printing form comprising a) a support, and b) at least one elastomeric layer on the support having a top surface containing an imagewise printing relief, wherein the top surface also contains in a non-image area a print control element comprising relief elements with defined height differences.

2. The flexographic printing form of claim 1 wherein the print control element comprises at least two relief elements of defined height difference.

3. The flexographic printing form of claim 1 wherein the print control element comprises at least three relief elements of defined height difference with a center element of defined height and the elements of both sides having the same defined height differences compared to the center element.

4. The flexographic printing form of claim 3 wherein the print control element is a bar code.

5. The flexographic printing form of claim 1 wherein the elastomeric layer is formed from a photopolymerizable layer containing at least one elastomeric binder, at least one ethylenically unsaturated compound photopolymerizable by actinic radiation, and at least one photoinitiator or photoinitiator system.

6. The flexographic printing form of claim 5 wherein an integrated IR-sensitive layer is disposed on the top surface for use as a photomask.

7. The flexographic printing form of claim 6 further comprising at least one additional layer disposed between the IR-sensitive layer and the top surface wherein the additional layer is being selected from the group consisting of an elastomeric layer capable of becoming photosensitive, a release layer and a wax layer.

8. The flexographic printing form of claim 5 further comprising at least one additional layer disposed on the top surface wherein the additional layer is selected from the group consisting of an elastomeric layer capable of becoming photosensitive, a release layer and a wax layer.

9. The flexographic printing form of claim 8 wherein the release layer comprises at least one matting agent capable of being anchored in the surface of the photopolymerizable layer.

10. A process for preparing a flexographic printing form containing an imagewise printing relief comprising:

providing at least one elastomeric layer having a top surface adapted to contain an imagewise printing relief; and forming in a non-image area of the elastomeric layer a print control element comprising relief elements with defined height differences.

11. The process of claim 10 wherein the elastomeric layer comprises a photopolymerizable layer containing at least one elastomeric binder, at least one ethylenically unsaturated compound photopolymerizable by actinic radiation, and at least one photoinitiator or photoinitiator system, the process further comprising:

A) exposing the photopolymerizable layer to actinic radiation through a photomask forming polymerized areas and unpolymerized areas in the photopolymerizable layer, B) removing the photomask, and C) removing unpolymerized areas to form in the top surface of the photopolymerizable layer the imagewise printing relief and the print control element.

12. The process of claim 11 wherein the forming step is performed by impressing a negative matrix of the print control element comprising relief elements with defined height differences into the top surface of the photopolymerizable layer.

13. A flexographic printing form produced by the process of claim 12.

14. The process of claim 11 wherein an integrated infrared sensitive ablation layer is disposed on the top surface, the process further comprising the step of imagewise exposing the infrared sensitive layer to infrared laser radiation to form both the photomask and a high resolution pattern capable of filtering actinic radiation during the exposing step to form the print control element.

15. A flexographic printing form produced by the process of claim 14.

16. The process of claim 11 where the step B) of removing the photomask is performed during step C).

17. The process of claim 11 wherein the removing step C) is selected from the group consisting of (1) developing with at least one washout solution selected from the group consisting of solvent solution, aqueous solution, semi-aqueous solution, and water; and (2) heating the photopolymerizable layer to a temperature sufficient to cause the unpolymerized portions to melt, flow, or soften, and contacting the photopolymerizable layer with an absorbent material to remove the unpolymerized portions.

18. The process of claim 10 wherein the elastomeric layer comprises a laser-engravable, reinforced elastomeric layer, the process further comprising:

A) imagewise ablating the laser-engravable, reinforced elastomeric layer to form the printing relief, and B) forming the print control element by ablating the non-image area of the elastomeric layer to provide the relief elements with defined height differences.

19. A flexographic printing form produced by the process of claim 18.

* * * * *